United States Patent [19]
Lin et al.

[11] Patent Number: 6,157,070
[45] Date of Patent: *Dec. 5, 2000

[54] PROTECTION CIRCUIT AGAINST LATCH-UP IN A MULTIPLE-SUPPLY INTEGRATED CIRCUIT

[75] Inventors: Shi-Tron Lin, Taipei; Ta-Lee Yu, Hsinchu Hsien, both of Taiwan

[73] Assignee: Winbond Electronics Corporation, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/027,533

[22] Filed: Feb. 23, 1998

[30] Foreign Application Priority Data

Feb. 24, 1997 [TW] Taiwan .................................. 86102203

[51] Int. Cl.$^7$ ........................... H01L 29/76; H01L 29/94; H01L 27/10; H01L 31/113; H01L 31/119
[52] U.S. Cl. ........................ 257/392; 257/393; 257/207; 257/355; 257/356; 257/357
[58] Field of Search .................................. 257/355, 356, 257/546, 369, 371, 357, 207, 392, 393

[56] References Cited

U.S. PATENT DOCUMENTS

| | | | |
|---|---|---|---|
| 4,920,396 | 4/1990 | Shinohara et al. | 357/42 |
| 5,182,621 | 1/1993 | Hinooka | 257/546 |
| 5,406,513 | 4/1995 | Canaris et al. | 365/181 |
| 5,491,358 | 2/1996 | Miyata | 257/546 |
| 5,581,103 | 12/1996 | Mizukami | 257/355 |
| 5,742,465 | 4/1998 | Yu . | |
| 5,760,631 | 6/1998 | Yu et al. . | |
| 5,828,119 | 10/1998 | Katsube | 257/546 |
| 5,920,089 | 7/1999 | Kanazawa et al. | 257/202 |

OTHER PUBLICATIONS

Microelectronic Circuits; Sedra and Smith; Chapter 7, sections 7.1, 7.2, 1987.

*Primary Examiner*—Mahshid Saadat
*Assistant Examiner*—Jesse A. Fenty
*Attorney, Agent, or Firm*—Fish & Richardson P.C.

[57] ABSTRACT

In a multiple-supply CMOS IC, if VDDH is applied slower than VDDL during powering up, some diffusion junctions normally reversed-biased may momentarily become forward-biased and produce latch-up to produce permanent damage to circuits. Therefore a protection circuit against latch-up in a multiple-supply IC is provided. The protection circuit comprises an N-channel MOSFET, which has its gate connected to the high-voltage bus, its drain connected to the low-voltage supply, and its source connected to the low-voltage bus to control the power-up sequence of high voltage and low voltage for the multiple-supply IC and to prevent latch-up. The N-channel MOSFET can be of different modes, such as enhancement mode, depletion mode or enhancement mode having a low threshold voltage.

39 Claims, 5 Drawing Sheets

PROTECTION CIRCUIT AGAINST LATCH-UP IN A MULTIPLE-SUPPLY INTEGRATED CIRCUIT

BACKGROUND OF THE INVENTION

1. Field of the Invention

The present invention relates to a semiconductor integrated circuit (IC), and especially relates to a protection circuit against latch-up in a multiple-supply integrated circuit, which is made of complementary metal-oxide semiconductor (CMOS).

2. Description of the Related Art

The CMOS process has become a major trend in the semiconductor process of IC fabrication. The CMOS process is characterized by the use of well structures, which can produce a minimum space taken by circuits by forming circuit components of different conductivity types on the same substrate. On the other hand, in order to increase suitability of ICs for applications in different systems, the CMOS IC is generally provided with a multiple-supply. FIG. 1 shows a cross-sectional diagram of a conventional CMOS IC, wherein an n-type substrate 10 and a p-well 20 respectively provide a p-type metal-oxide semiconductor field-effect transistor (PMOSFET) device and an n-type metal-oxide semiconductor field-effect transistor (NMOSFET) device. The PMOSFET device comprises a source/drain region, which is made of doped diffusion regions 22 and 24 in the substrate 10, and a gate 25 formed thereover. The NMOSFET device comprises a source/drain region, which is made of doped diffusion regions 14 and 12 in the p-well 20, and a gate 15 formed thereover. In the substrate 10, there is an n-doped diffusion region 27 to provide a bias voltage to the substrate 10; and in the p-well 20, there is a p-doped diffusion region 17 to provide a bias voltage to the p-well 20.

FIG. 2 shows an equivalent circuit of the CMOS structure. In FIG. 2, the PMOSFET has a source connected to a VDDL supply, a drain connected to a drain of the NMOSFET, a gate connected to a gate of the NMOSFET, and a base biased by a VDDH supply. The NMOSFET has a source and a base, both of them connected to a VSS supply. In other words, referring to FIG. 1, the gate 15 is connected with the gate 25; the n$^+$-type diffusion region 12 is connected to the p$^+$-type diffusion region 24; the p$^+$-type diffusion region 22 is connected to the VDDL supply; the n$^+$-type diffusion region 27 is connected the VDDH supply; and both of the n$^+$-type diffusion region 14 and the p$^+$-type diffusion region 17 are connected to the VSS supply. Because different supplies bias the p$^+$-type diffusion region 22 and the n$^+$-type diffusion region 27, both formed in the n-type substrate 10, a multiple-supply effect is produced. For example, the VDDL supply can supply 3.3V or 5V while the VDDH supply supplies 5V.

However, as shown in FIG. 1, a latch-up effect in the substrate may easily appear because of an undesirable power-on sequence for the device made by the foregoing process. When a 5V or 12V supply is switched on, the rise time from 0V to full amplitude (5V or 12V) takes about 5–100 ms, depending on the capacitors in the supply and the power supply values. As shown in FIG. 1, if the VDDL supply (3.3V) has been switched on, and the VDDH supply is fed into the circuit after a while. During the long rise time of the VDDH supply from 0V to about 2.7V, a considerably low bias voltage appears in the n-type well, and the p$^+$-type diffusion region 22 has been biased to about 3.3V by the VDDL supply. A forward bias appears at the pn junction that is formed by the n-type well 20 and the p$^+$-type diffusion region 22. A large amount of forward current, caused by this forward bias, will introduce a triggering effect for the pnpn structure in the substrate 10 and the p-well 20. Then a latch-up effect is produced. Once the latch-up effect is produced, permanent damage to the IC structure can not be avoided.

As a limitation of the current IC fabrication technology, it is difficult, even impossible, to fabricate devices having the same functions of the foregoing device by a method completely different from the conventional CMOS process. The latch-up effect accompanies the application of the CMOS well region technology and is difficult to prevent. This problem is more serious in the design for a multiple-supply IC. As a result, guard ring is used to overcome this problem. However, the guard ring can not absorb the forward current in IC since the guard ring is only designed located near the I/O pad. Hence, the effect of preventing latch-up is limited; and another problem is resulted from a large space occupied by the guard ring. Therefore, there is a need to improve the characteristics of the IC and prevent problems from the extremely high forward current in the IC based on the current CMOS technology.

FIG. 3A and FIG. 3B show a structure to prevent latch-up, disclosed in U.S. Pat. No. 4,871,927, which uses a MOSFET to prevent direct biasing with floating input terminal from incurring latch-up in a two-supply CMOS circuit. However, a pn junction between the well region and a diffusion region inside may be conducted at the same time to inject a large amount of carriers into the well region. Thus, this prior art can not completely prevent an occurrence of latch-up.

SUMMARY OF THE INVENTION

Therefore, the present invention provides a protection circuit against latch-up in multiple-supply ICs. The present invention utilizes an NMOSFET for controlling a power-up sequence of a substrate (or well region) and a diffusion region to prevent an occurrence of latch-up.

The structure for preventing latch-up according to this invention is suitable for different supply requirements, such as 12V/5V, 5V/3.3V, or 3.3V/2.5V, etc. The different supply requirements can be achieved by modifying the doped concentration for NMOSFET.

DESCRIPTION OF THE DRAWINGS

Other objectives, features, and advantages of the present invention will become apparent from the following detailed description made with reference to an illustrative but non-limiting embodiment. The description is made with reference to the accompanying drawings, in which.

DESCRIPTION OF THE PREFERRED EMBODIMENT

The present invention provides a protection circuit against latch-up in at least one multiple-supply IC. Further, the multiple-supply IC is grounded via a ground bus, a low-voltage input terminal of the multiple-supply IC is connected to a low-voltage supply via a low-voltage bus, and a high-voltage input terminal of the multiple-supply IC is connected to a high-voltage supply via a high-voltage bus. The circuit comprises an N-channel MOSFET, which has its gate connected to the high-voltage bus, its drain connected to the low-voltage supply, and its source connected to the low-voltage bus to control the power-up sequence of high voltage and low voltage for the multiple-supply IC and to prevent latch-up. The N-channel MOSFET can be of different modes, such as enhancement mode, depletion mode or enhancement mode having a low threshold voltage. Several embodiments of the present invention are described below.

Figure 4A:
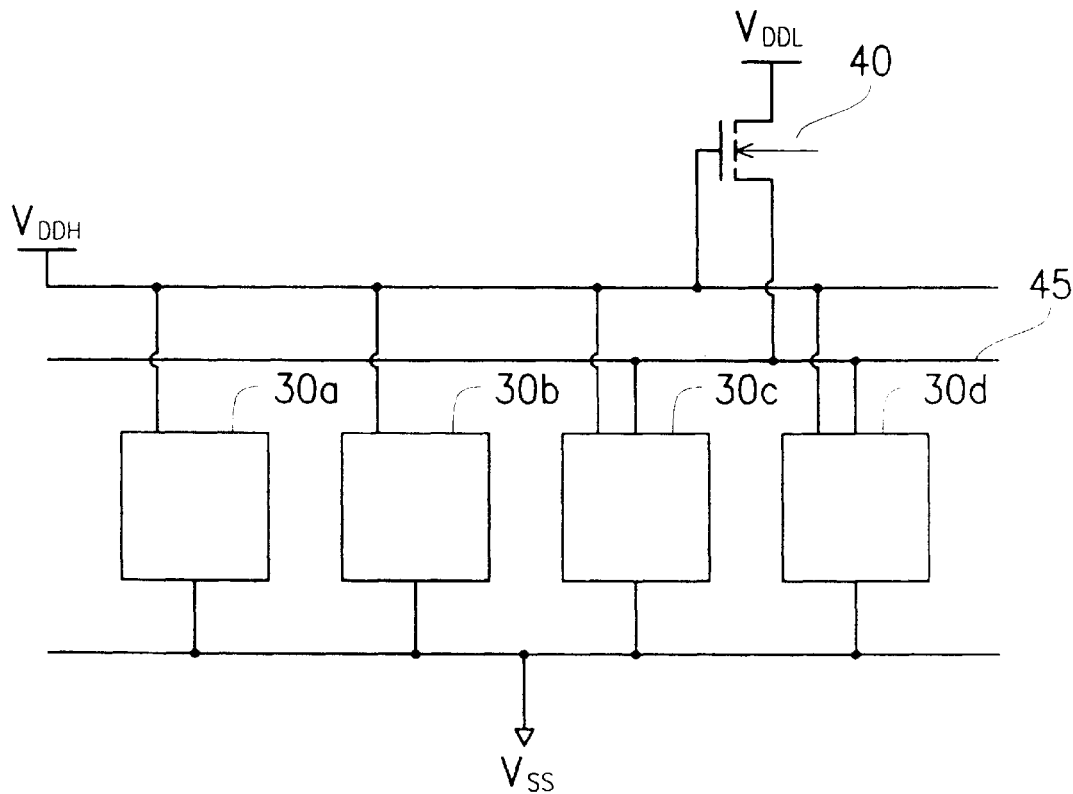
FIG. 4A is a circuit diagram of an embodiment according to the present invention.

FIG. 4A shows the first embodiment of the present invention, which is suitable for a multiple supply IC having a high voltage supply VDDH of 12V and a low voltage supply VDDL of 5V. A MOSFET used in the first embodiment is an enhancement-mode NMOSFET 40, in which the threshold voltage Vt is raised from 0.5V~1V to 2V~2.5V due to the body effect. The channel is turned off when the gate voltage is 0V, and turned on when the gate voltage is larger than the threshold voltage. In this case, when VDDH is smaller than Vt, VDDL can not enter into the CMOS circuits 30c and 30d, and when VDDH is larger than Vt+VDDL, NMOSFET 40 is turned on, so that the VDDL can enter into the CMOS circuits 30c and 30d. Regarding to CMOS circuits 30a and 30b, such CMOS circuits are those only receive VDDH voltage in practical applications.

Figure 1:
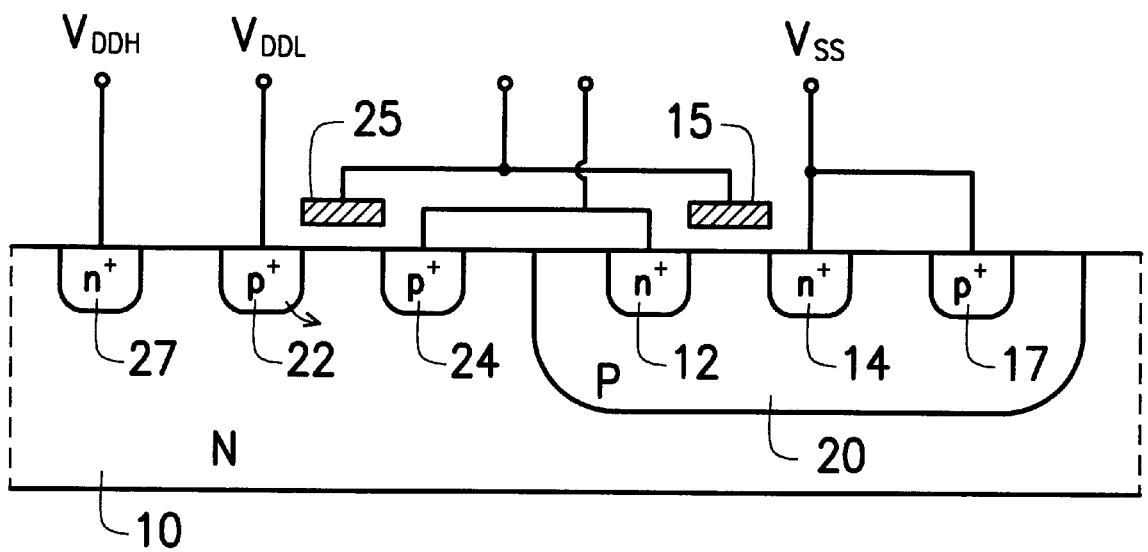
FIG. 1 is a cross-sectional diagram of a conventional well region structure of IC fabricated with CMOS technology.
Figure 2:
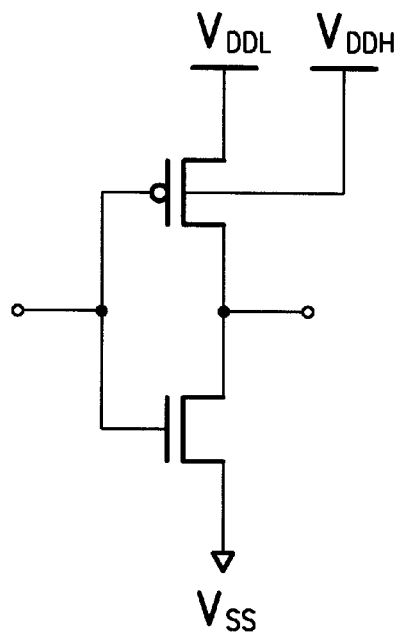
FIG. 2 is an equivalent circuit diagram of the structure shown in FIG. 1.
Figure 3A:
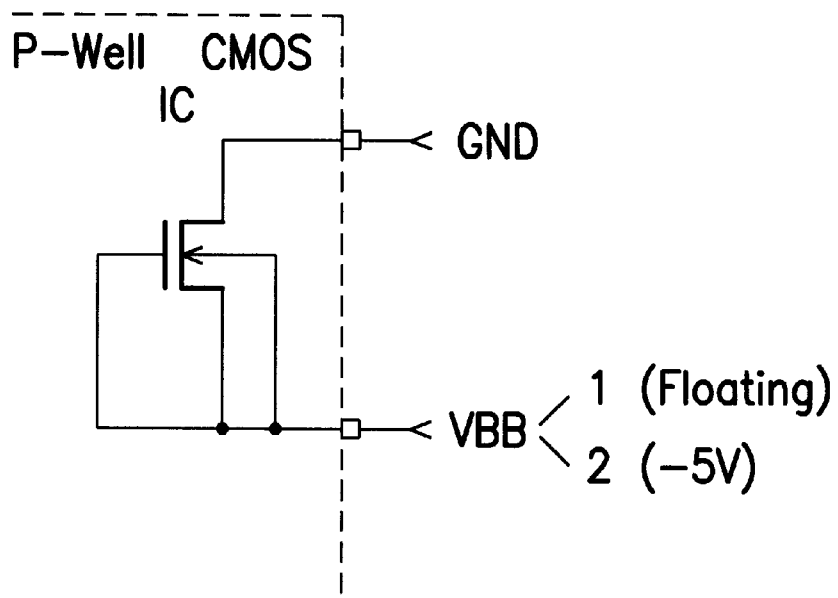
FIG. 3A is a diagram illustrating a circuit structure in the prior art.
Figure 3B:
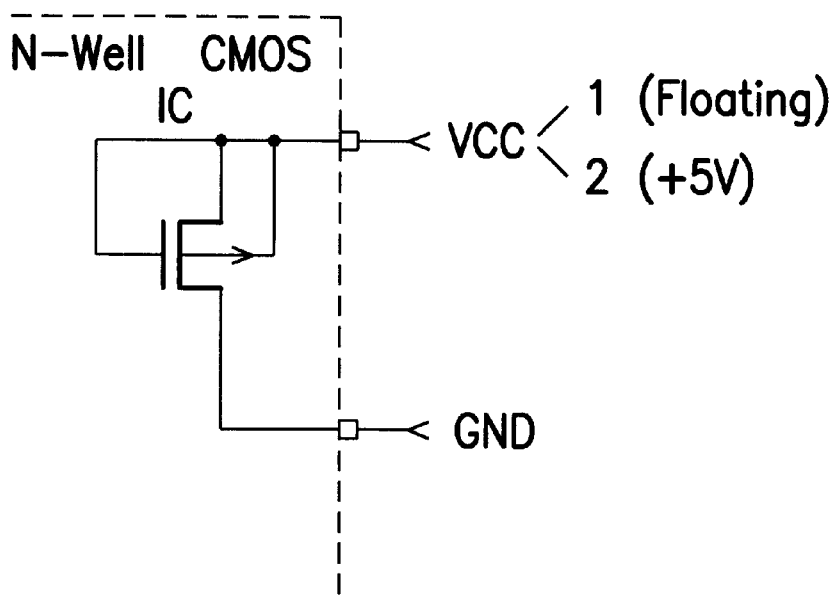
FIG. 3B is a diagram illustrating another circuit structure in the prior art.

Referring to FIG. 1, VDDL is connected to a $p^+$ diffusion region 22 in the n-type substrate 10; and VDDH is connected to the n-type substrate 10. If VDDH is applied to the n-type substrate 10 earlier than VDDL, the pn junction formed between the $p^+$ diffusion region 22 and the n-type substrate 10 is always reversed-biased; and no latch-up occurs. On the other hand, if VDDL is applied to the n-type substrate 10 earlier, the NMOSFET 40 is turned off due to an absence of VDDH. VDDL can not enter into CMOS circuits 30c and 30d until VDDH is greater than VDDL+Vt. Then NMOSFET 40 is turned on to enter VDDL into CMOS circuits 30c and 30d. However, since VDDH is greater than VDDL at this time, the latch-up does not occur.

The size of the NMOSFET 40 must be large enough to provide a low resistance when the NMOSFET 40 is turned on to eliminate the voltage difference between the VDDL supply and the VDDL bus 45. The total channel width of a conventional NMOSFET is larger than 100 μm. The channel length depends on the fabrication technology. Generally speaking, the channel length is smaller than 10 μm for a submicron MOS device. For example, an NMOSFET in a ±12V/5V RS-232 I/O chip has a channel width of about 1200 μm, a channel length of 3.5 μm, and a threshold voltage of 1V.

To a 5V/3.3V multiple-supply IC, although an enhancement-mode NMOSFET is turned on at about 5V, there is no well conductance at about 3.3V. That is because the gate voltage must be larger than VDDL by at least a threshold voltage Vt in order to pass VDDL. However, because of the body effect, the threshold voltage rises along with the rising in NMOSFET source voltage, i.e., VDDL. For example, when the source voltage is 0V, the threshold voltage of the NMOSFET is 0.7V; but when the source voltage rises to 3.3V, the threshold voltage also rises to 1.5V. Because VDDH (5V) is only larger than VDDL+Vt (3.3V+1.5V) by 0.2V, the NMOSFET can not provide good conductance.

Therefore, the second embodiment of the present invention replaces the enhancement-mode NMOSFET in the first embodiment with an enhancement-mode NMOSFET having a low threshold voltage, which is about 0V~0.2V. The circuit structure of the second embodiment is still as shown in FIG. 4A. The fabrication of a low-threshold enhancement-mode NMOSFET in this embodiment utilizes a photoresist as a mask to block the enhancement implantation of NMOSFET during the fabrication of the device. In the low-threshold enhancement-mode NMOSFET, the body effect can be eliminated by a lower doping concentration for the substrate. As a result, there is no need to make VDDH to be much larger than VDDL to achieve a lower conductive resistance for the NMOSFET. For example, the threshold voltage of NMOSFET is 0V while the source voltage is 0V, but rises to 0.3V while the source voltage rises to 3.3V. Because VDDH (5V) is larger than VDDL+Vt (3.3V+0.3V) by 1.4V, the NMOSFET can provide good conductance. Therefore, in this embodiment, the use of a low-threshold enhancement-mode NMOSFET prevents the 5V/3.3V multiple-supply IC from latch-up while power-on.

Figure 4B:
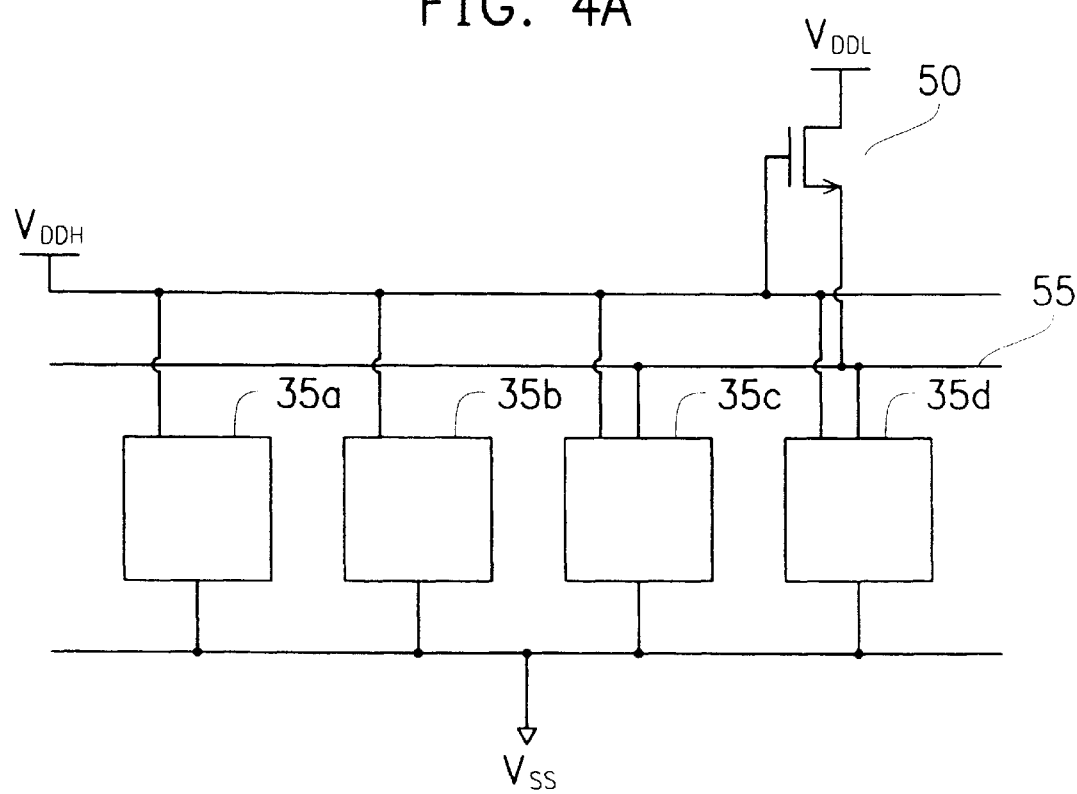
FIG. 4B is a circuit diagram of another embodiment according to the present invention.

FIG. 4B shows a third embodiment of the present invention. The third embodiment of the present invention utilizes a depletion-mode NMOSFET 50 having a threshold voltage of about −0.05V~−1.5V. The depletion-mode NMOSFET can be made by introducing a process of buried-channel depletion implantation into a regular enhancement implantation in the fabrication of an NMOSFET. This embodiment of the present invention can be used in a multiple-supply IC of about 3.3V/2.5V or lower. A plurality of multiple-supply ICs 35a~35d of about 3.3V/2.5V are taken for an example to describe the operations while simultaneously referring to FIG. 1 and FIG. 4B. First, because a voltage difference between the substrate and the source of an NMOSFET is about 3.3V, an effective threshold voltage rises, for example, from −1.5V to −0.5V. In order to turn on the NMOSFET, VDDH must be larger than a sum of VDDL and the threshold voltage, i.e. VDDH must be larger than 2V (2.5V+ (−0.5V)). When the VDDL bus is connected to the VDDL supply and charged to about 2.5V, VDDH is already larger than 2V. The voltage difference therebetween is equal to or less than 0.5V, which is not sufficient to cause forward conduction for the pn junction between the $p^+$ diffusion region connected to VDDL and the n-type substrate connected to VDDH. Therefore, it does not cause latch-up since only few carriers are injected into n-type substrate via this pn junction. Furthermore, when the gate voltage of the NMOSFET finally reaches VDDH, i.e., about 3.3V, the voltage difference, 3.3V−2V=1.3V, is sufficient to provide a good conductance for the NMOSFET 50 to connect VDDL bus 55 and VDDL supply to the CMOS circuits 35c and 35d. In practical application, the CMOS circuits 35a and 35b are CMOS circuits, which only receive VDDH.

Figure 5A:
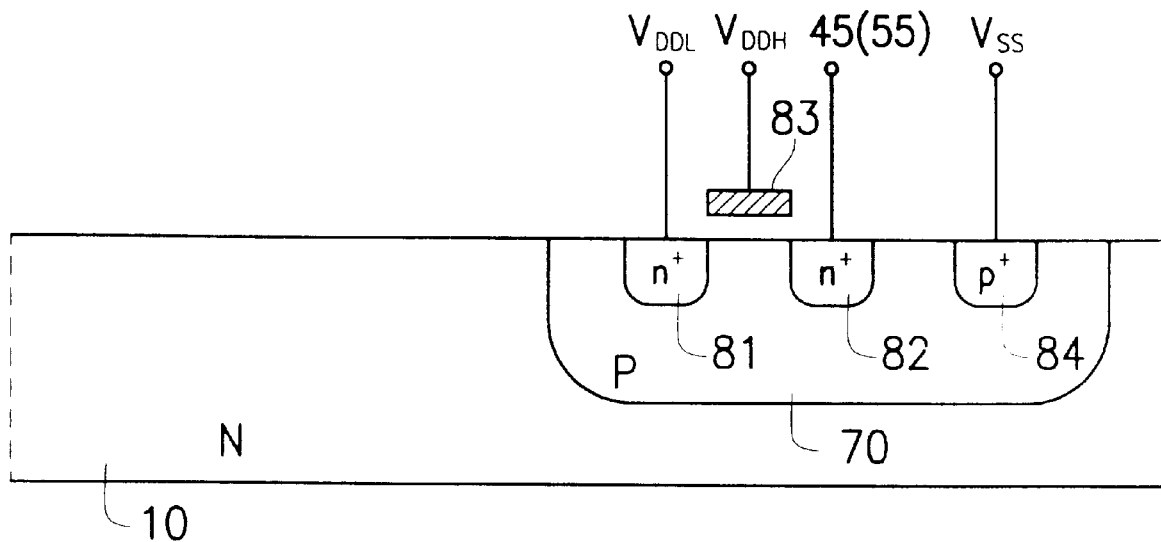
FIG. 5A is a cross-sectional diagram of an NMOSFET utilized by the present invention.

In the above three embodiments, as shown in FIG. 5A, the NMOSFET, such as 40 of FIG. 4A or 50 of FIG. 4B, including a drain 81, a source 82 and a gate 83 is formed in the p-well region 70 of n-type substrate 10. Furthermore, the NMOSFET has the gate 83 connected to VDDH supply, the drain 81 connected to the VDDL supply, and the source 82 connected to the VDDL bus 45 of FIG. 4A (or 55 of FIG.

4B), and the p-type doped diffusion region 84 is grounded. Since the p-well region 70 is biased to grounded, a body effect is produced, and the threshold voltage Vt rises.

In order to turn on the NMOSFET, VDDH must be larger than Vt+VDDL. Because of the rising of threshold voltage Vt, the turn-on margin between VDDH and Vt+VDDL becomes smaller and results in a worse conduction. For example, in the case of VDDH is 5V and VDDL is 3.3V, the threshold voltage Vt is raised from 0.7V (when the source voltage is 0V) to 1.5V (when the source voltage is 3.3V) due to the body effect. Therefore, VDDH is only larger than Vt+VDDL by 0.2V.

Figure 5B:
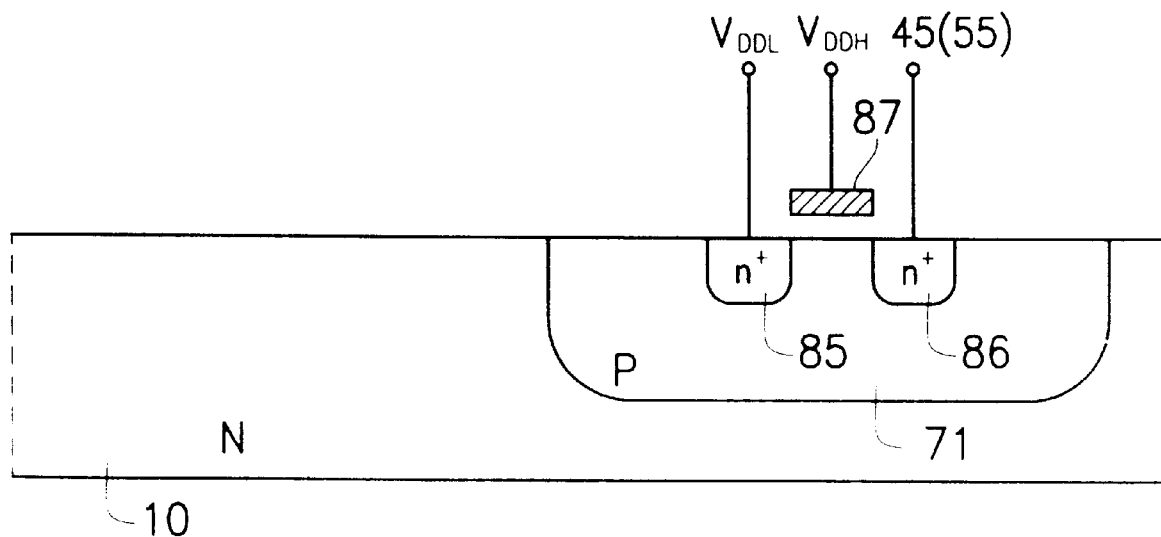
FIG. 5B is a cross-sectional diagram of another NMOSFET utilized by the present invention.

FIG. 5B shows another embodiment of an NMOSFET according to the present invention. The NMOSFET, such as 40 of FIG. 4A or 50 of FIG. 4B, which is formed in the p-well region 71 on the n-type substrate 10, has a gate 87 connected to VDDH supply, a drain 85 connected to VDDL supply, and a source 86 connected to a VDDL bus 45 of FIG. 4A(or 55 of FIG. 4B). Since the p-well region 71 has not been biased and is floating, the threshold voltage Vt is not risen. VDDH (5V) is larger than Vt+VDDL (0.7V+3.3V) by 1.0V and thus can provide good conductance for the NMOSFET.

Figure 5C:
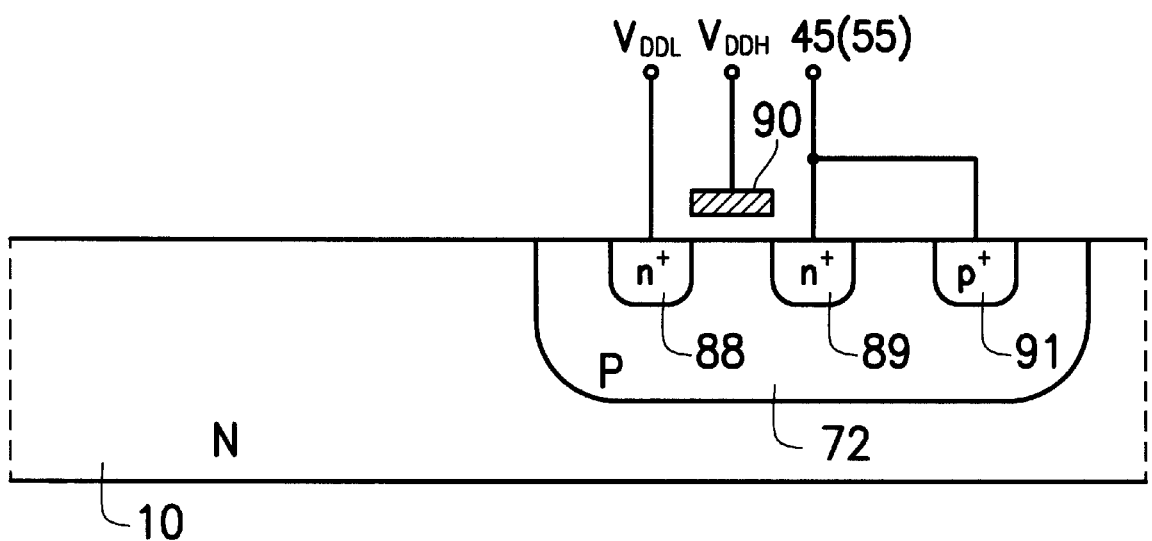
FIG. 5C is a diagram illustrating another embodiment of an NMOSFET according to this invention.

FIG. 5C shows another embodiment of an NMOSFET according to this invention. The NMOSFET, such as 40 of FIG. 4A or 50 of FIG. 4B, which is formed in the p-well region 72 in the n-type substrate 10, has a gate 90 connected to the VDDH supply, a drain 88 connected to the VDDL supply. A source 89 and a p-type doped diffusion region 91 in the p-well region 72 are both connected to a VDDL bus 45 of FIG. 4A(or 55 of FIG. 4B). Since the p-well region 72 has the same electrical potential as the source 89, the threshold voltage Vt is not risen. The voltage VDDH(=5V) is larger than Vt+VDDL(=0.7V+3.3V) by 1V and can provide a good conduction for the NMOSFET.

In the above embodiments, when a low-threshold enhancement-mode NMOSFET is employed, all NMOSFETs in CMOS are processed by enhancement implantation except the low-threshold enhancement-mode NMOSFET, which is processed by blocking the enhancement implantation using a photoresist mask during the enhancement-implant process step. When a depletion-mode NMOSFET is used, all NMOSFETs in CMOS are processed by blocking a buried-channel depletion implantation using a photoresist mask, except the depletion-mode NMOSFET, which is processed by introducing a process of buried-channel depletion implantation into the regular enhancement implantation.

Having described the invention in connection with preferred embodiments, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical application, thereby enabling others skilled in this technology to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A multiple-power-supply integrated circuit, comprising:
   a CMOS circuit block configured to be powered, in operation, by a first power source indirectly through a power bus and a second power source;
   a MOS transistor having a gate electrically connected solely to said second power source, one source/drain connected to said first power source, and another source/drain connected to said power bus;
   wherein said first power source is coupled to said power bus when the voltage relation between said first and second power sources meeting a predetermined condition during a power-on sequence.

2. The integrated circuit of claim 1 wherein said MOS transistor is an N-channel transistor.

3. The integrated circuit of claim 2 wherein said MOS transistor is an enhancement-mode NMOS transistor.

4. The integrated circuit of claim 2 wherein said MOS transistor is a low-threshold enhancement-mode NMOS transistor.

5. The integrated circuit of claim 2 wherein said MOS transistor is a depletion-mode NMOS transistor.

6. The integrated circuit of claim 2 wherein said MOS transistor is formed in a p-well.

7. The integrated circuit of claim 6 wherein said p-well has a $p^+$-doped region connected to the ground.

8. The integrated circuit of claim 6 wherein said p-well is floating.

9. The integrated circuit of claim 6, further including a $p^+$ doped region in said p-well, wherein a $p^+$ doped region connected to said power bus.

10. The integrated circuit of claim 6 wherein said circuit block comprises a CMOS circuit having a well connected to said second power source.

11. The integrated circuit of claim 10 wherein said well is an n-well.

12. The integrated circuit of claim 1 wherein said circuit block is powered by a third power bus.

13. The integrated circuit of claim 12 wherein said third power bus is a ground bus.

14. The integrated circuit of claim 13 wherein said third power bus is $V_{SS}$ bus.

15. The integrated circuit of claim 1, wherein a gate of same MOFSET couples to said second power source through electrical connection.

16. The integrated circuit of claim 1, wherein said second power source having a voltage magnitude greater than said first power source during circuit operation.

17. The integrated circuit of claim 1, wherein said predetermined condition is said second power source having a voltage magnitude greater than said first power source by a predetermined amount.

18. The integrated circuit of claim 1, wherein said predetermined condition is said second power source having a voltage magnitude greater than said first power source by a threshold-voltage magnitude of said MOS transistor.

19. The integrated circuit of claim 1, wherein said second power source having a voltage level higher than said first power source during circuit operation.

20. The integrated circuit of claim 1, wherein said predetermined condition is said second power source having a voltage level higher than said first power source by a predetermined amount.

21. The integrated circuit of claim 1, wherein said predetermined condition is said second power source having a voltage level higher than said first power source by a threshold-voltage magnitude of said MOS transistor.

22. The integrated circuit of claim 1, wherein said MOS transistor is formed in a well.

23. The integrated circuit of claim 1, wherein said MOS transistor is formed in a floating well.

24. The integrated circuit of claim 1, wherein said MOS transistor is formed in a well electrically coupled to said power bus.

25. The integrated circuit of claim 1, wherein said gate is coupled to said second power source without being electrically connected to another power source.

26. The integrated circuit of claim 1, wherein, during a power-on sequence, the gate potential of said MOS transistor changes in the same direction as the change in the transient potential of said second power source.

27. A circuit arrangement, comprising:
    a power bus;
    a first power source for providing a first voltage at a first voltage level;
    a second power source for providing a second voltage at a second voltage level, said second voltage level being greater than the first voltage level;
    a CMOS integrated circuit configured to be powered, in operation, by said first power source and said second power source;
    a MOS transistor having a gate, a source, and a drain, said gate electrically electrically connected solely to said second power source, one of said source and said drain connected to said first power source, and the other of said source and said drain connected to said power bus;
    wherein said transistor is configured such that during a power-on sequence of the circuit arrangement, said first power source is only coupled to said power bus by said MOS transistor when said second power source has a voltage magnitude greater than said first power source.

28. The integrated circuit of claim 27 wherein said MOS transistor is an N-channel transistor.

29. The integrated circuit of claim 28 wherein said MOS transistor is a low-threshold enhancement-mode NMOS transistor.

30. The integrated circuit of claim 28 wherein said MOS transistor formed in a p-well having a $p^+$-doped region connected to the ground.

31. The integrated circuit of claim 28 wherein said integrated circuit comprises a CMOS circuit having a well connected to said second power source.

32. The integrated circuit of claim 27 wherein said integrated circuit is powered by a ground bus.

33. The circuit arrangement of claim 27, wherein, during a power-on sequence, the gate potential of said MOS transistor changes in the same direction as the change in the transient potential of said second power source.

34. The circuit arrangement of claim 27, wherein during a power-on sequence, the gate potential of said MOS transistor changes in the same direction as the change in the transient potential of said second power source.

35. A multiple-power-supply integrated circuit, comprising:
    a CMOS circuit block configured to be powered, in operation, by a first power source indirectly through a power bus and a second power source;
    a MOS transistor having a gate electrically connected solely to said second power source, one source/drain connected to said first power source, and another source/drain connected to said power bus;
    wherein said power bus electrically couples to said first power source after the voltages of said first and second power sources meeting a predetermined condition during a power-on event.

36. The integrated circuit of claim 35, wherein said predetermined condition is said second power source having a larger voltage magnitude than said first power source by a predetermined amount.

37. The integrated circuit of claim 35, wherein said predetermined condition is said second power source having a higher voltage level than said first power source by a predetermined amount.

38. The integrated circuit of claim 35, wherein said gate is coupled to said second power source without being electrically connected to another power source.

39. The integrated circuit of claim 35, wherein during a power-on sequence, the gate potential of said MOS transistor changes in the same direction as the change in the transient potential of said second power source.

* * * * *